(12) United States Patent
Bruell et al.

(10) Patent No.: US 11,181,563 B2
(45) Date of Patent: Nov. 23, 2021

(54) CIRCUIT-BREAKER AND MOBILE DEVICE

(71) Applicant: Siemens Aktiengesellschaft, Munich (DE)

(72) Inventors: Marco Bruell, Berlin (DE); Christoph Boerzsoenyi, Regensburg (DE); Michael Gerstner, Roettenbach (DE); Ilka Jakubowski, Falkensee (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/023,779

(22) Filed: Sep. 17, 2020

(65) Prior Publication Data

US 2021/0096161 A1    Apr. 1, 2021

(30) Foreign Application Priority Data

Sep. 27, 2019    (DE) ...................... 10 2019 214 821.2

(51) Int. Cl.
   *H01H 71/12*     (2006.01)
   *G01R 19/252*    (2006.01)
   *H01H 71/02*     (2006.01)
   *G01R 19/25*     (2006.01)

(52) U.S. Cl.
   CPC ....... *G01R 19/252* (2013.01); *G01R 19/2509* (2013.01); *H01H 71/025* (2013.01); *H01H 71/123* (2013.01)

(58) Field of Classification Search
   CPC .............. G01R 19/252; G01R 19/2509; H01H 2009/0083; H01H 71/123; H01H 71/025; H02H 7/30; H02H 3/335; H02H 3/006; H02H 3/08; H02H 3/0935; H02H 3/044
   See application file for complete search history.

(56) References Cited

U.S. PATENT DOCUMENTS

| | | | | |
|---|---|---|---|---|
| 5,136,457 | A | * | 8/1992 | Durivage, III ......... H02H 3/006 361/42 |
| 2016/0063822 | A1 | | 3/2016 | Schwinn et al. |
| 2016/0064915 | A1 | | 3/2016 | Schwinn |
| 2016/0178673 | A1 | | 6/2016 | Borgwardt et al. |
| 2016/0322805 | A1 | | 11/2016 | Franke et al. |

(Continued)

FOREIGN PATENT DOCUMENTS

| DE | 102014217292 A1 | 3/2016 |
|---|---|---|
| DE | 102014217332 A1 | 3/2016 |

(Continued)

*Primary Examiner* — Bryan R Perez
(74) *Attorney, Agent, or Firm* — Harness, Dickey & Pierce, P.L.C.

(57) ABSTRACT

A circuit-breaker includes an electronic trip unit, which initiates an interruption or reduction of the current flow in a low-voltage circuit when current or current-time limits are exceeded in the low-voltage circuit. The electronic trip unit includes at least two processors that independently check whether current or current-time limits are being exceeded. A test signal is fed to the circuit-breaker via a first communication interface, which is fed to one of the two processors during operation so that a test of the circuit-breaker is carried out during operation, while at the same time an active protection is provided with regard to the exceeding of current or current-time limits.

20 Claims, 2 Drawing Sheets

(56) References Cited

U.S. PATENT DOCUMENTS

| | | |
|---|---|---|
| 2016/0329696 A1 | 11/2016 | Franke et al. |
| 2016/0365214 A1 | 12/2016 | Franke et al. |
| 2017/0053759 A1 | 2/2017 | Borgwardt |
| 2017/0243702 A1 | 8/2017 | Franke et al. |
| 2018/0076611 A1 | 3/2018 | Geissler et al. |
| 2018/0114660 A1 | 4/2018 | Kupsch et al. |
| 2019/0067929 A1 | 2/2019 | Kopaczewski et al. |
| 2019/0385806 A1 | 12/2019 | Plank et al. |
| 2020/0013574 A1 | 1/2020 | Krauss et al. |
| 2020/0051767 A1 | 2/2020 | Stehle |

FOREIGN PATENT DOCUMENTS

| | | |
|---|---|---|
| DE | 102014218831 A1 | 3/2016 |
| DE | 102014218910 A1 | 3/2016 |
| DE | 102015217108 A1 | 3/2016 |
| DE | 102014224173 A1 | 6/2016 |
| DE | 102015216981 A1 | 6/2016 |
| DE | 102015226475 A1 | 11/2016 |
| DE | 102016201651 A1 | 11/2016 |
| DE | 102016202827 A1 | 11/2016 |
| DE | 102015210479 A1 | 12/2016 |
| DE | 102016201659 A1 | 12/2016 |
| DE | 102015216023 A1 | 2/2017 |
| DE | 102016205196 A1 | 10/2017 |
| DE | 102016217425 A1 | 3/2018 |
| DE | 102016221093 A1 | 4/2018 |
| DE | 102017201239 A1 | 7/2018 |
| DE | 102017205003 A1 | 9/2018 |
| DE | 102017205004 A1 | 9/2018 |
| DE | 102017211900 A1 | 1/2019 |
| DE | 102017212477 A1 | 1/2019 |
| DE | 102017214903 A1 | 2/2019 |
| DE | 102017214907 A1 | 2/2019 |
| DE | 102017215820 A1 | 3/2019 |

\* cited by examiner

CIRCUIT-BREAKER AND MOBILE DEVICE

PRIORITY STATEMENT

The present application hereby claims priority under 35 U.S.C. § 119 to German patent application number DE 102019214821.2 filed Sep. 27, 2019, the entire contents of which are hereby incorporated herein by reference.

FIELD

Various example embodiments of the invention generally relate to a low-voltage circuit-breaker, a mobile device, a method for a low-voltage circuit-breaker, a computer program product and a computer-readable medium.

BACKGROUND

Circuit-breakers are protection devices, which function in a similar way to a fuse. Circuit-breakers monitor the current flowing through them via a conductor and interrupt the electric current or flow of energy to an energy sink or a load, which is referred to as tripping, when protection parameters, such as current limit values or current/time period limit values, that is to say when a current value is present for a certain time period, are exceeded. Interruption is performed, for example, by contacts of the circuit-breaker, which are opened. In contrast to a fuse, in a circuit-breaker these protection parameters or response values can be set, for example via a control unit, such as an electronic trip unit.

Particularly for low-voltage electrical circuits or supply systems, there are various types of circuit-breakers, depending on the level of the provided electric current in the electrical circuit. Within the meaning of the invention, circuit-breaker means, in particular, switches as are used in low-voltage installations for currents of from 63 to 6300 amperes. Molded case circuit-breakers are especially used for currents of from 63 to 1600 amperes, in particular of from 125 to 630 or 1200 amperes. Air circuit-breakers are used, in particular, for currents of from 630 to 6300 amperes, especially of from 1200 to 6300 amperes.

Air circuit-breakers are also termed ACB for short and molded case circuit-breakers are termed MCCB for short.

Low voltage means voltages up to 1000 volts AC or 1500 volts DC. Low voltage also means, in particular, voltages greater than extra-low voltage, with values of 50 volts AC or 120 volts DC.

Within the meaning of embodiments of the invention, circuit-breaker means circuit-breakers with an electronic trip unit, ETU for short, which serve as a control unit. The control unit monitors the level of the electrical current measured by sensors such as a Rogowski transformer (Rogowski coil), or additionally in an analogous manner, that of the voltage and/or other parameters of the electrical circuit, and causes an interruption of the electrical circuit when thresholds are exceeded.

Before delivery to customers, a routine test is carried out to examine and verify that all circuit-breakers leave production without any faults. The correct functioning of the protection functions implemented in the circuit-breaker is also verified. Since many circuit-breakers are installed in critical systems or are in operation for a very long time, a method must be provided for also functionally testing the devices periodically in the field or in the application. Different methods are offered to the customer for this purpose.

Primary Current Test: In the primary current test, signals are fed into the circuit-breaker at the designated connections or main current paths via a high-performance low-voltage current source, so that the former initiates a trip according to the programmed current-time characteristic. The evaluation of the measured tripping times can be used to determine whether the switch is operating according to specification and whether the mechanical opening of the circuit-breaker is functioning properly.

Secondary Current Test: For the secondary current test, access is required to the secondary side of the current transformers which measure the current in the main current paths. To do this, the electronic trip unit (ETU) must be removed from the switching device. Precise current and/or voltage values are applied to the inputs of the electronic trip unit normally provided for sensors in order to verify the functioning of the trip unit. With this method it is not possible to verify the mechanical functioning of the circuit-breaker.

Another way to check the switching device is to issue a trip command to the electronic trip unit via an external signal. In this case, only the basic mechanical function of the switch is checked. The current-time characteristic is not checked.

The above test methods have the problem that they are either complicated (primary current test, removal of the trip unit for the secondary test using complex test equipment) or are unable to fully test all functions (testing via a trip command), so that only a small, incomplete part of the functional tripping chain is checked.

Furthermore, increasingly complex protection algorithms are implemented in the protective devices/circuit-breakers, which can no longer be checked by feeding in simple current and voltage signals.

Circuit-breakers of the above-mentioned type are known, for example, from the following patent applications: DE 10 2014 217 292 A1; DE 10 2014 217 332 A1; DE 10 2015 217 108 A1; DE 10 2014 218 831 A1; DE 10 2014 218 910 A1; DE 10 2016 201 651 A1; DE 10 2015 226 475 A1; DE 10 2015 216 981 A1; DE 10 2016 202 827 A1; DE 10 2016 201 659 A1; DE 10 2015 210 479 A1; DE 10 2014 224 173 A1; DE 10 2015 216 023 A1; DE 10 2016 217 425 A1; DE 10 2016 205 196 A1; DE 10 2016 221 093 A1; DE 10 2017 211 900 A1; DE 10 2017 201 239 A1; DE 10 2017 205 003 A1; DE 10 2017 205 004 A1; DE 10 2017 212 477 A1; DE 10 2017 214 903 A1; DE 10 2017 214 907 A1; DE 10 2017 215 820 A1.

SUMMARY

At least one embodiment of the present invention improve the testing of a low-voltage circuit-breaker of the type mentioned above, in particular to carry out a check of the current and current-time limits (current-time characteristic), in particular in conjunction with a mechanical test, more specifically to carry this out during operation while maintaining the protection functions of the circuit-breaker.

Embodiments are directed to a low-voltage circuit-breaker, a mobile device, a method, a computer program product or a computer-readable medium.

According to at least one embodiment of the invention, a circuit-breaker for protecting a low-voltage circuit is proposed, comprising:

a housing, input and output connections for conductors of the low-voltage circuit which are connected within the housing by current paths having a contact system, a current sensor for determining the level of the current of at least one conductor of the low-voltage circuit, in particular with a current sensor for each (phase) conductor of the low-voltage circuit, an electronic trip unit connected to the current sensor and the contact system, which initiates an interruption or reduction of the current flow in the low-voltage circuit via the contact system if current or current-time limits in the low-voltage circuit are exceeded, wherein the contact system can be implemented as an electromechanical contact system (interruption) or an electronic contact system (e.g. reduction), e.g. via semiconductor switches, or as a combination of both.

According to at least one embodiment of the invention, a mobile device has a display unit, an operating unit and a communication unit that has a second communication interface. According to at least one embodiment of the invention, the mobile device is designed in such a way that it can generate test signals for a circuit-breaker according to the invention, in particular via an (internal) computing unit, and can transmit them via the second communication interface.

According to at least one embodiment the invention, a parallel method is also claimed. The method according to at least one embodiment the invention for a circuit-breaker with an electronic trip unit that interrupts or reduces the current flow in a low-voltage circuit when current or current/time limits are exceeded in the low-voltage circuit is characterized by the fact that the electronic trip unit has at least two processors that check independently of each other whether the current or current-time limits are exceeded. A test signal can be fed to the circuit-breaker via a first communication interface, which signal can be fed to one of the two processors during operation so that a test of the circuit-breaker can be carried out during operation, while at the same time an active protection is provided (by the other processor, i.e. the processor that does not receive test signals) with regard to the exceeding of current or current-time limits.

According to at least one embodiment of the invention, a parallel computer program product and a computer-readable medium are also disclosed.

At least one embodiment of the invention is directed to a circuit-breaker for protecting a low-voltage circuit, comprising:

a housing;

input connections and output connections, for conductors of the low-voltage circuit, connected internally by current paths having a contact system;

a current sensor to determine a level of current of at least one conductor of the conductors of the low-voltage circuit, an electronic trip unit, connected to the current sensor and the contact system, to initiate an interruption or reduction of current flow in the low-voltage circuit via the contact system upon current or current-time limits in the low-voltage circuit being exceeded, the electronic trip unit including at least one analog-to-digital converter, to which a signal is fed from the current sensor, digitized and fed in parallel to two processors, each processor of the two processors being configured to evaluate the signal independently of the other processor of the two processors, with regard to the current or current-time limits being exceeded; and a first communication interface, connected to the electronic trip unit, the circuit-breaker being designed to allow test signals to be fed to one processor of the two processors via the first communication interface during operation, to carry pout a test of the circuit-breaker during operation, a protection function, with regard to the exceeding of current or current-time limits, being simultaneously active.

At least one embodiment of the invention is directed to a method for a circuit-breaker including an electronic trip unit, to initiate an interruption or reduction of current flow in a low-voltage circuit when a first current or current-time limits are exceeded in the low-voltage circuit, the electronic trip unit including at least two processors to each independently perform a check to determine whether current or current-time limits are exceeded, the method comprising:

feeding a test signal the circuit-breaker via a first communication interface, the test signal then being fed to one of the two processors during operation; and carrying out a test of the circuit-breaker during operation via one processor of the two processors, a protection function, with regard to the exceeding of current or current-time limits, being simultaneously active with regard to the exceeding of current or current-time limits.

At least one embodiment of the invention is directed to a non-transitory computer program product, storing a computer program, the computer program being loadable into a memory device of a computing unit, and the computer program being configured to carry out the method of an embodiment when the computer program is executed on the computing unit.

At least one embodiment of the invention is directed to a non-transitory computer readable medium storing a computer program, the computer program being loadable into a memory device of a computing unit, and the computer program being configured to carry out the method of an embodiment when the computer program is executed on the computing unit.

BRIEF DESCRIPTION OF THE DRAWINGS

The described properties, features and advantages of this invention and the manner in which they are achieved become more clearly and distinctly comprehensible in conjunction with the following description of the example embodiments, which are explained in more detail in connection with the drawing.

Here, in the drawings.

DETAILED DESCRIPTION OF THE EXAMPLE EMBODIMENTS

Figure 1:
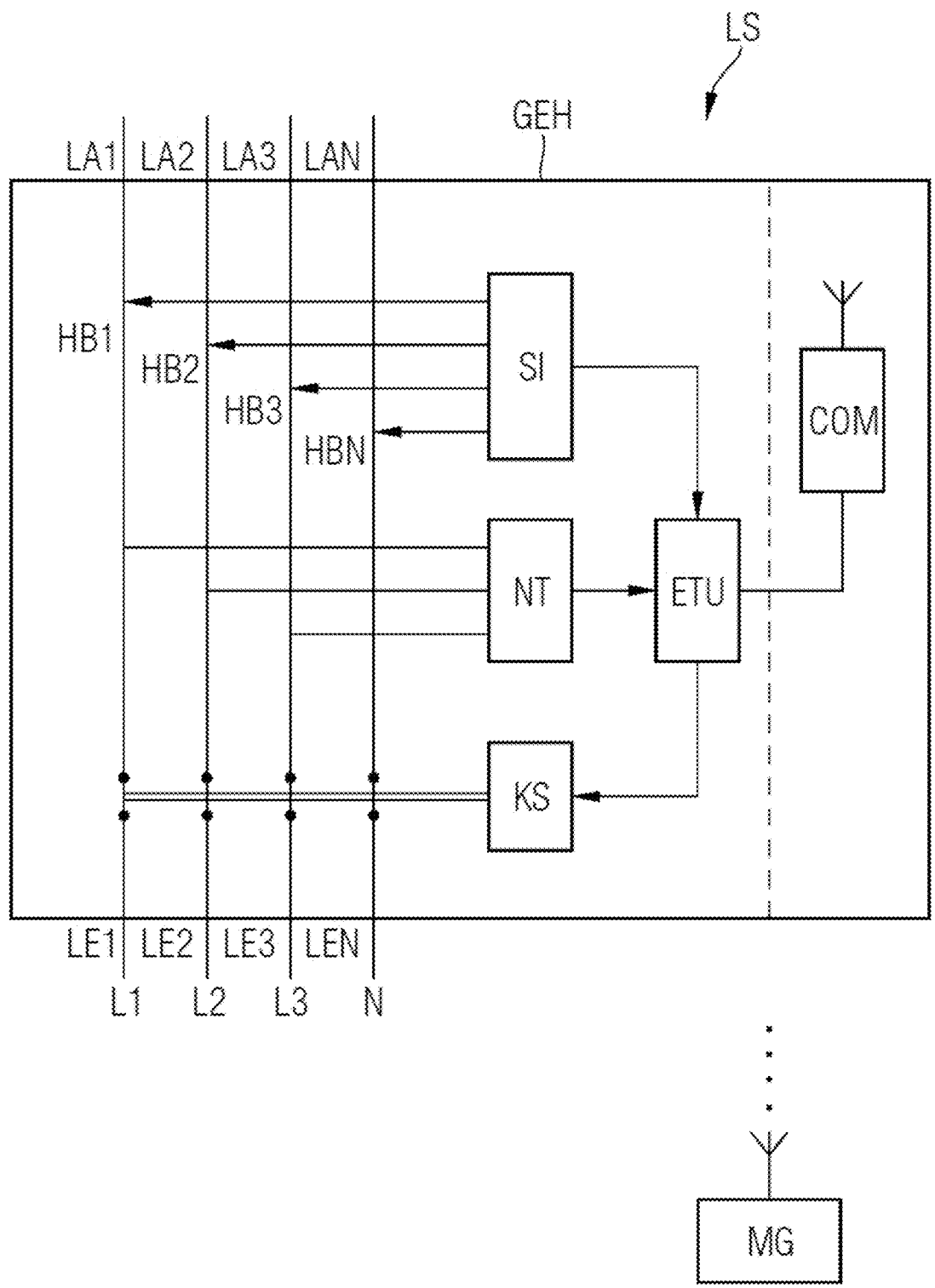
FIG. 1 shows a schematic representation of a circuit-breaker of an embodiment.

The above and other elements, features, steps, and concepts of the present disclosure will be more apparent from the following detailed description in accordance with example embodiments of the invention, which will be explained with reference to the accompanying drawings.

Some examples of the present disclosure generally provide for a plurality of circuits, data storages, connections, or electrical devices such as e.g. processors. All references to these entities, or other electrical devices, or the functionality provided by each, are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a program code that is embodied in a non-transitory computer readable medium programmed to perform any number of the functions as disclosed.

It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations, and elements illustrated in the drawings are not necessarily shown to scale. Rather, the various elements are represented such that their function and general purpose become apparent to a person skilled in the art. Any connection, or communication, or coupling between functional blocks, devices, components, or other physical or functional units shown in the drawings or described herein may also be implemented by an indirect connection or coupling. A communication between devices may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion.

In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

According to at least one embodiment of the invention, a circuit-breaker for protecting a low-voltage circuit is proposed, comprising:

a housing, input and output connections for conductors of the low-voltage circuit which are connected within the housing by current paths having a contact system, a current sensor for determining the level of the current of at least one conductor of the low-voltage circuit, in particular with a current sensor for each (phase) conductor of the low-voltage circuit, an electronic trip unit connected to the current sensor and the contact system, which initiates an interruption or reduction of the current flow in the low-voltage circuit via the contact system if current or current-time limits in the low-voltage circuit are exceeded, wherein the contact system can be implemented as an electromechanical contact system (interruption) or an electronic contact system (e.g. reduction), e.g. via semiconductor switches, or as a combination of both.

According to at least one embodiment of the invention, it is provided that the electronic trip unit is provided with at least one analog-to-digital converter, to which a signal is fed from the current sensor, which is digitized and the digitized signal is fed in parallel to two processors which evaluate said signal independently of each other with regard to the exceeding of current or current-time limits. A first communication interface is provided, which is connected to the electronic trip unit. The circuit-breaker is further designed in such a way that test signals can be fed to one of the two processors via the first communication interface during operation, so that a test of the circuit-breaker can be carried out during operation while the protection function (via the other processor, i.e. the one that does not receive test signals) with regard to the exceeding of current or current-time limits remains simultaneously active.

An advantage of at least one embodiment of the invention is that a simple check of a circuit-breaker, in particular of essential functions, is achieved while allowing the correct functioning to be checked as accurately as possible under the most realistic conditions. Furthermore, it has the advantage that the protective functions of the circuit-breaker continue to be activated during the test mode, so that an interruption (in this case not due to the test signals, but due to an actual fault) can potentially occur.

Advantageous embodiments are specified in the claims.

In an advantageous embodiment of the invention, the first communication interface is a wired interface, in particular a USB interface.

This has the particular advantage that a particularly simple and practical solution for feeding in test signals is available.

In an advantageous embodiment of the invention, the first communication interface or the feeding of the test signals to the processor is secured by a code or/and is carried out via a secure communication connection.

This has the particular advantage that a test mode is only possible for authorized persons who have the appropriate code or access to the secure communication connection, so that manipulation or the like can be prevented.

In an advantageous embodiment of the invention, an OR unit is provided which is connected on the input side to outputs of the processors and on the output side to a control input of the contact system.

This has the particular advantage that the outputs of the processors are linked in a simple manner to interrupt the low-voltage circuit.

In an advantageous embodiment of the invention, (only) one processor is connected to a control input of the contact system. The processors are interconnected. The processor that is not connected to the control input sends a trip command to the processor connected to the control input of the contact system in order to interrupt the low-voltage circuit.

This has the particular advantage that an alternative control is provided and the processor connected to the control input is informed of the trip command of the other processor, so that the processor connected to the control input can carry out a further check as necessary.

In an advantageous embodiment of the invention, a power supply unit is provided that is connected both to the current paths and also to the electronic trip unit.

This has the particular advantage that an internal supply of power to the circuit-breaker is provided, and so an external power supply can be omitted.

In an advantageous embodiment of the invention, the first communication interface is connected to only one of the two processors.

This has the particular advantage that a particularly simple implementation is provided, which is sufficient for many use cases.

In an advantageous embodiment of the invention, the circuit-breaker is designed in such a way that during a test of the circuit-breaker during operation, activation of the contact system is suppressed when current or current-time limits are exceeded by the test signal, so that the test signal does not cause any interruption or reduction of the current flow in the low-voltage circuit. The feedback indicating a successful test can be provided, for example, via an indicator on the circuit-breaker or/and via the first communication interface, to the mobile device that indicates the successful test.

According to at least one embodiment of the invention, a mobile device for generating test signals is disclosed.

According to at least one embodiment of the invention, a mobile device has a display unit, an operating unit and a communication unit that has a second communication interface. According to at least one embodiment of the invention, the mobile device is designed in such a way that it can generate test signals for a circuit-breaker according to the invention, in particular via an (internal) computing unit, and can transmit them via the second communication interface.

This has the particular advantage that a particularly simple device for generating test signals is available.

In an advantageous embodiment of the invention, the test signals are equivalent to the digital signals output by the analog-to-digital converter.

This has the particular advantage that the test signals can be fed in very simply.

In an advantageous embodiment of the invention, the mobile device is a computer, particularly a portable one. This comprises a computer program that generates the test signals.

This has the particular advantage that a particularly cost-effective and practical solution is available.

According to at least one embodiment the invention, a parallel method is also claimed. The method according to at least one embodiment the invention for a circuit-breaker with an electronic trip unit that interrupts or reduces the current flow in a low-voltage circuit when current or current/time limits are exceeded in the low-voltage circuit is characterized by the fact that the electronic trip unit has at least two processors that check independently of each other whether the current or current-time limits are exceeded. A test signal can be fed to the circuit-breaker via a first communication interface, which signal can be fed to one of the two processors during operation so that a test of the circuit-breaker can be carried out during operation, while at the same time an active protection is provided (by the other processor, i.e. the processor that does not receive test signals) with regard to the exceeding of current or current-time limits.

This has the particular advantage that a method for performing a simple check of a circuit-breaker, in particular of essential functions, is provided while allowing the correct functioning to be checked as accurately as possible under the most realistic conditions. Furthermore, it has the advantage that the protective functions of the circuit-breaker continue to be activated during the test mode, so that an interruption (in this case not due to the test signals, but due to an actual fault) can potentially occur.

In an advantageous embodiment of the invention, the test signal can be supplied to one or the other processor.

This has the particular advantage that both processors can be checked with their corresponding evaluation routines, in particular with regard to the exceeding of current or current/time limits, but also other limits, wherein protection is always provided by the other processor.

According to at least one embodiment of the invention, a parallel computer program product and a computer-readable medium are also disclosed.

All embodiments, whether in a dependent form referenced back to other embodiments or referenced back solely to individual features or combinations of features of patent claims, in particular including dependent patent claims, result in an improvement of a low-voltage circuit-breaker.

FIG. 1 shows a circuit-breaker LS according to an embodiment of the invention for a low-voltage circuit, in the example a three-phase AC circuit with three phase conductors L1, L2, L3 and a neutral conductor N, comprising:
  first connections LE1, LE2, LE3, LEN for the low-voltage circuit, for example on a housing GEH, which are connected via (housing-internal) main current paths HB1, HB2, HB3, HBN to second connections LA1, LA2, LA3, LAN for the low-voltage circuit, for example on the housing GEH;
  a contact system KS which can interrupt the main current paths HB1, HB2, HB3, HBN in order to cause an interruption of the low-voltage circuit;
  a sensor unit SI which detects the electrical current or other electronic parameters of the main current paths HB1, HB2, HB3, HBN or of at least one main current path or of the low-voltage circuit;
  an electronic trip unit ETU (control unit) connected to the sensor unit SI and the contact system KS and, if at least one limit of the electronic parameter is exceeded, causes an interruption of the main current paths HB1, HB2, HB3, HBN via the contact system KS;

a power supply unit NT connected to the electronic trip unit ETU and the main current paths HB1, HB2, HB3, HBN for supplying power to the electronic trip unit ETU (control unit); for example, in a standard configuration, one main current path forms the primary side of an energy converter of the power supply unit; and a first communication interface (COM) connected to the electronic trip unit ETU. This can be arranged inside or outside the housing GEH, as indicated by dashed lines.

In FIG. 1 a mobile device MG is also provided, with a communication unit (not illustrated) which has a second communication interface that enables a wireless communication to the first communication interface; a display unit, and an operating unit. Furthermore, the mobile device has a computing unit (not illustrated).

The first communication interface can be a wired interface, in particular a USB interface.

Alternatively or additionally, the first communication interface can also be a wireless interface. The same applies to the second communication interface, which can be a wired, in particular USB, or/and a wireless interface. Communication between the two interfaces should be guaranteed.

Figure 2:
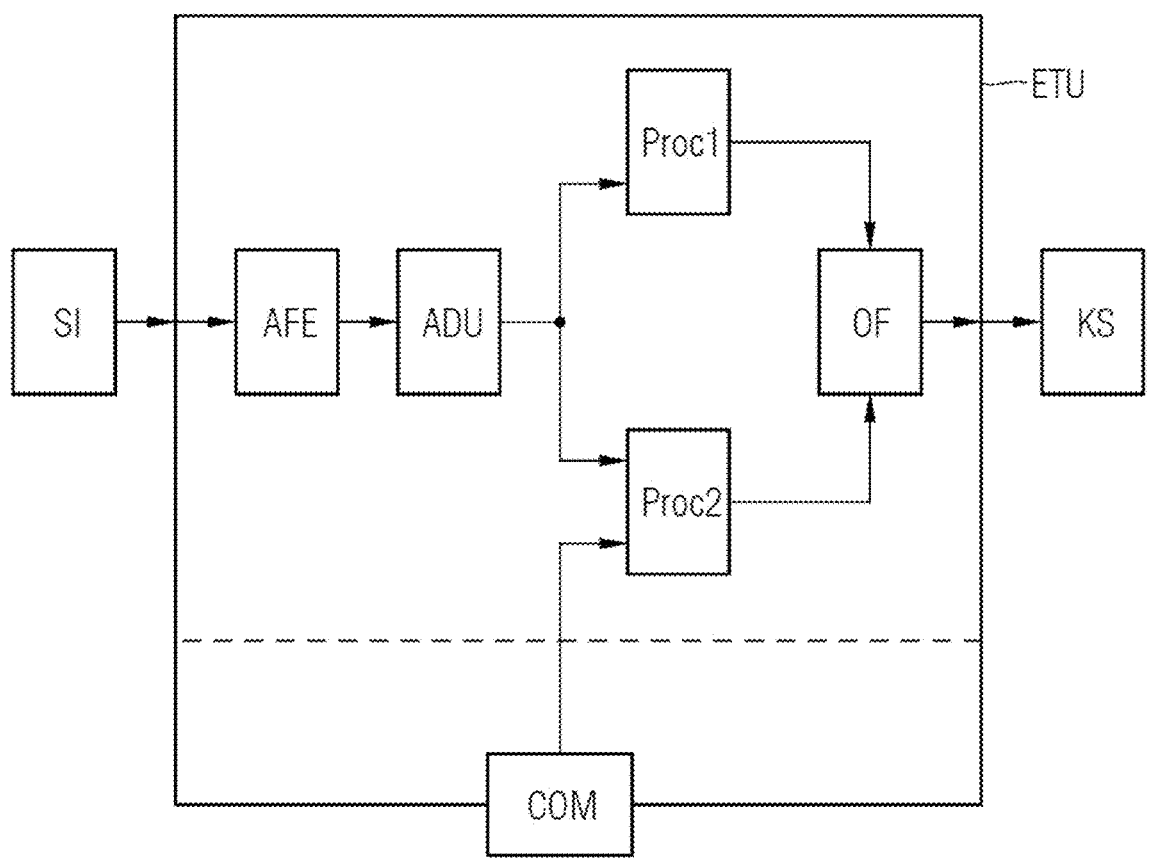
FIG. 2 shows a schematic representation of an electronic trip unit of an embodiment.

FIG. 2 shows a schematic representation of an electronic trip unit ETU (control unit) according to an embodiment of the invention of a circuit-breaker LS, comprising:

an (optional) analog signal conditioning unit AFE, to which the signal from the SI sensor unit is fed or which is connected to the SI sensor unit, for analog processing (filtering, amplification, integration or/and offset, etc.) of the signal of the sensor unit SI;

an analog-to-digital converter ADU connected to the analog signal processing unit AFE, which converts the input analog signal into a digital signal; alternatively, the signal from the sensor unit SI can be fed directly to the analog-to-digital converter ADU;

two processors Proc1, Proc2, to which the digitized signal of the analog-to-digital converter ADU is fed in parallel, which evaluate said signal independently with regard to the exceeding of current and/or current-time limits or/and other limits (voltage, frequency, harmonics, differential currents, ground fault currents, etc.), wherein one processor can also evaluate other or more limits than the other processor;

a first communication interface COM, which may be provided inside or outside the electronic trip unit ETU, wherein the first communication interface COM in the example according to FIG. 2 is connected to the second processor Proc2; alternatively or additionally, the first communication interface COM may also be connected to the first processor Proc1; and an OR unit OF which is connected to the outputs of the first and second processors Proc1, Proc2 on the input side and is connected to the (control input of) the contact system KS on the output side, the OR unit OF provides a (logical) Or function.

The circuit-breaker LS or electronic trip unit ETU is designed in such a way that via the first communication interface COM, test signals, which are ideally equivalent to the digital signals output by the analog-to-digital converter, i.e. correspond to the digitized signals of the sensor unit SI, can be or are fed to one of the two processors (or both processors Proc1, Proc2) during operation so that a test of the circuit-breaker is/can be carried out during operation (in particular when the low-voltage circuit is passing current and is/will be protected by the circuit-breaker). The processor which is not supplied with the test signals ensures a (simultaneously) active protection function, in particular with regard to the exceeding of current or current-time limits.

The first communication interface COM can be a wired interface, in particular a USB interface. Alternatively or additionally, it can also be a wireless interface. In particular, the first communication interface and/or the feeding of the test signals to the processor via the first communication interface can be secured by a code etc., in a standard way. Alternatively or additionally, a secure communication connection can be set up.

Test signals can be fed to the one or other processor either in succession or alternately.

Ideally, in test mode, the interruption of the electrical low-voltage circuit can be suppressed, for example by a corresponding function, for example in the firmware of one or both processors Proc1, Proc2, when a test mode is initiated or detected.

When the test signals are fed to both processors, a test mode can be started via a processor-internal activation, i.e. switching over to the test signals, e.g. via firmware. In doing so it should advantageously be ensured that only one processor is in the test mode.

Alternatively, the test signals can also be fed in from the communication interface to the respective processor via a changeover switch.

In a simple configuration, only one processor can receive the test signals, for example, only one connection from the communication interface to a processor is provided, wherein on both processors (Proc1, Proc2) the same routines (duplication) are activated with the same threshold values set on the circuit-breaker. In this way, it can be checked whether the parameters that are set give rise to the desired tripping characteristic. Due to the same routines and thresholds running on both processors, it can be assumed that the other processor will behave in the same way.

In the following, the invention and its advantages are presented again but with different wording.

Using a software (computer program product) on a computer or a mobile device MG, simple and complex load situations can be generated or simulated as test signals for a circuit-breaker. The software conditions these signals so that they can be sent or transmitted via the second communication interface to the first communication interface of the circuit-breaker LS or the electronic trip unit ETU.

According to an embodiment of the invention the test signals are fed in between the analog-to-digital converter and the processor or at the processor, so that the electronic trip unit or the processor receives or perceives them as real, actual signals, in particular current signals. For example, the electronic trip unit ETU is not put into a special test mode, but is designed to execute its protection algorithms implemented and running on its processor (e.g. microcontroller (MCU)), as in normal operation. The processor (microcontroller) sees and evaluates the test signals and/or their sample values (digitized signals) in exactly the same form as it would for the digitized signals of the analog-to-digital converter.

Using the solution described here, for the execution of the protection algorithms there is no difference between actual signals or fed-in test signals. The circuit-breaker always operates in the normal mode. There is no artificial definition of trip commands and desired tripping times. This entails a significant advantage over known solutions from the prior art.

Since both actual signals as well as test signals are fed to the trip unit, in particular via the same channel, and in particular since no physical separation is performed, the test signals can be overwritten by the actual ones at any time, for example. This ensures that in the event of a fault, the protection of the system is guaranteed at all times.

Moreover, the electronic trip unit ETU is tested with the protection parameters that are currently set. As there is no test mode provided, the testing of the device is always performed in the real environment. Any change in the protection parameters while the test signals are being fed in has a direct influence on the expected tripping behavior.

Another advantage is that every point of the tripping characteristic (current-time limits) can be checked. There is no longer any dependence on the performance and accuracy of an input signal source (primary or secondary current test). Even signals that do not correspond to a pure sine wave can be generated. In this way, existing load conditions are represented exactly and all active protection functions can be tested.

A customer or technician can test individual protection functions. For this purpose, appropriate test signals are suggested to them in the software/computer program product on the mobile device (e.g. laptop). Nevertheless, all protection functions (as set) are active. In this way, it can also be verified whether the desired protection function has been activated (check for incorrect settings). The system response corresponds to the actual protection specifications of the circuit-breaker.

The software can be stored on a computer-readable medium, such as a floppy disk, CD-ROM, USB stick or similar, in particular with code, in order to be able to use a mobile device available on site.

By importing an arbitrary test signal, all active protection functions of the circuit-breaker can be checked in total.

The test signals are fed in, in particular, via a secure communication process. Thus, misuse can be prevented or reduced.

Although the invention has been described and illustrated in detail by way of the example embodiment, the invention is not restricted by the disclosed examples and other variations can be derived herefrom by a person skilled in the art without departing from the scope of protection of the invent ion.

Although the invention has been illustrated in greater detail using the example embodiments, the invention is not limited by the disclosed examples, and a person skilled in the art can derive other variations therefrom without departing from the scope of protection of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A circuit-breaker for protecting a low-voltage circuit, comprising:
   a housing;
   input connections and output connections, for conductors of the low-voltage circuit, connected internally by current paths having a contact system;
   a current sensor to determine a level of current of at least one conductor of the conductors of the low-voltage circuit,
   an electronic trip unit, connected to the current sensor and the contact system, to initiate an interruption or reduction of current flow in the low-voltage circuit via the contact system upon current or current-time limits in the low-voltage circuit being exceeded, the electronic trip unit including at least one analog-to-digital converter, to which a signal is fed from the current sensor, digitized and fed in parallel to two processors, each processor of the two processors being configured to evaluate the signal independently of the other processor of the two processors, with regard to the current or current-time limits being exceeded; and
   a first communication interface, connected to the electronic trip unit, the circuit-breaker being designed to allow test signals to be fed to one processor of the two processors via the first communication interface during operation, to carry out a test of the circuit-breaker during operation, a protection function, with regard to the exceeding of current or current-time limits, being simultaneously active.

2. The circuit-breaker of claim 1, wherein the first communication interface is a wired interface.

3. The circuit-breaker of claim 2, wherein the first communication interface is a USB interface.

4. The circuit-breaker of claim 2, wherein the first communication interface or supply of the test signals to the two processors is at least one of protected by a code and is carried out over a secure communication connection.

5. The circuit-breaker of claim 2, further comprising:
   an OR unit, connected to outputs of the two processors on the input side, to a control input of the contact system on the output side.

6. The circuit-breaker of claim 2, wherein one processor, of the two processors, is connected to a control input of the contact system, wherein the two processors are interconnected, and wherein the other processor, of the two processors, that is not connected to the control input, being configured to send a trip command to the one processor connected to the control input to interrupt the current flow.

7. A mobile device comprising: a display unit; an operating unit; and a communication unit including a second communication interface, the mobile device being designed to generate the test signals for the circuit-breaker of claim 1.

8. The mobile device of claim 7, wherein the mobile device is designed to generate the test signals for the circuit-breaker, via a computing unit, and output the test signals via the second communication interface.

9. The mobile device of claim 7, wherein the test signals are equivalent to the digital signals output by the analog-to-digital converter.

10. The mobile device of claim 7, wherein the mobile device is a computer, and includes a computer program to generate the test signals.

11. The mobile device of claim 7, wherein the mobile device is designed such that at least one of a code is attached to the generated test signals and a secure communication connection is enabled.

12. The circuit-breaker of claim 1, wherein the first communication interface or supply of the test signals to the two processors is at least one of protected by a code and is carried out over a secure communication connection.

13. The circuit-breaker of claim 1, further comprising:
an OR unit, connected to outputs of the two processors on the input side, to a control input of the contact system on the output side.

14. The circuit-breaker of claim 1, wherein one processor, of the two processors, is connected to a control input of the contact system, wherein the two processors are interconnected, and wherein the other processor, of the two processors, that is not connected to the control input, being configured to send a trip command to the one processor connected to the control input to interrupt the current flow.

15. The circuit-breaker of claim 1, further comprising:
a power supply, connected both to the current paths and to the electronic trip unit.

16. The circuit-breaker of claim 1, wherein the first communication interface is only connected to one processor of the two processors.

17. A method for a circuit-breaker including an electronic trip unit, to initiate an interruption or reduction of current flow in a low-voltage circuit when a current or current-time limits are exceeded in the low-voltage circuit, the electronic trip unit including at least one analog-to-digital converter and at least two processors to each independently perform a check to determine whether current or current-time limits are exceeded, the method comprising:
feeding a test signal to the circuit-breaker via a first communication interface, the test signal then being digitized by the at least one analog-to-digital converter and fed in parallel to two processors of the at least two processors, each processor of the two processors being configured to evaluate the signal independently of another processor of the two processors, with regard to the current or current-time limits being exceeded; and
carrying out a test of the circuit-breaker during operation via one processor of the at least two processors, a protection function, with regard to the exceeding of the current or current-time limits, being simultaneously active.

18. The method of claim 17, wherein the feeding of the test signal is at least one of secured by a code and carried out over a secured communication connection.

19. A non-transitory computer program product, storing a computer program, the computer program being loadable into a memory device of a computing unit, and the computer program being configured to carry out the method of claim 17 when the computer program is executed on the computing unit.

20. A non-transitory computer readable medium storing a computer program, the computer program being loadable into a memory device of a computing unit, and the computer program being configured to carry out the method of claim 17 when the computer program is executed on the computing unit.

* * * * *